United States Patent
Chen (10) Patent No.: US 8,644,024 B2
(45) Date of Patent: Feb. 4, 2014

(54) COOLING SYSTEM FOR SERVER AND COOLING METHOD FOR ELECTRONIC APPARATUS

(75) Inventor: Chien-An Chen, Taipei (TW)

(73) Assignee: Inventec Corporation, Taipei (TW)

( * ) Notice: Subject to any disclaimer, the term of this patent is extended or adjusted under 35 U.S.C. 154(b) by 354 days.

(21) Appl. No.: 13/158,543

(22) Filed: Jun. 13, 2011

(65) Prior Publication Data

US 2012/0113584 A1   May 10, 2012

(30) Foreign Application Priority Data

Nov. 5, 2010 (TW) .............................. 99138213 A (51) Int. Cl.
*H05K 7/20* (2006.01)
(52) U.S. Cl.
USPC ..... 361/701; 361/679.47; 361/696; 165/80.4; 165/104.33; 62/259.2
(58) Field of Classification Search
USPC ........ 361/679.46–679.54, 688–709, 716–720
See application file for complete search history.

(56) References Cited

U.S. PATENT DOCUMENTS

| | | | | |
|---|---|---|---|---|
| 6,796,372 B2 * | 9/2004 | Bear | ........................ | 165/104.21 |
| 6,819,563 B1 * | 11/2004 | Chu et al. | ....................... | 361/696 |
| 7,626,820 B1 * | 12/2009 | Konshak et al. | ............... | 361/700 |
| 8,289,710 B2 * | 10/2012 | Spearing et al. | ............... | 361/701 |
| 8,395,896 B2 * | 3/2013 | Belady | ........................... | 361/698 |
| 8,432,692 B2 * | 4/2013 | Peng et al. | ...................... | 361/699 |
| 8,437,129 B2 * | 5/2013 | Tung et al. | ................ | 361/679.47 |
| 8,441,789 B2 * | 5/2013 | Wu et al. | ................... | 361/679.49 |
| 8,456,833 B2 * | 6/2013 | Eagle | ....................... | 361/679.47 |
| 2006/0146496 A1 * | 7/2006 | Asfia et al. | ..................... | 361/700 |
| 2007/0227710 A1 * | 10/2007 | Belady et al. | ................. | 165/122 |
| 2012/0026691 A1 * | 2/2012 | Campbell et al. | ............. | 361/700 |

FOREIGN PATENT DOCUMENTS

TW   M346849   12/2008

* cited by examiner

*Primary Examiner* — Courtney Smith
(74) *Attorney, Agent, or Firm* — Morris Manning & Martin LLP; Tim Tingkang Xia, Esq.

(57) ABSTRACT

A cooling system for a server includes at least one radiator and at least one cooling plate that are installed in a server cabinet, a cooling assembly, a storage tank, and a heat exchanger. The cooling assembly is connected to the radiator, and is carried with a first cooling fluid therein. The storage tank is connected to the cooling plate, and is carried with a second cooling fluid therein. The first cooling fluid enters the heat exchanger through the radiator, and the second cooling fluid enters the heat exchanger through the cooling plate. The first cooling fluid and the second cooling fluid perform heat exchange in the heat exchanger, so as to reduce the temperature of the second cooling fluid, thus reducing the required energy enabling the second cooling fluid to return to a set temperature.

6 Claims, 5 Drawing Sheets

COOLING SYSTEM FOR SERVER AND COOLING METHOD FOR ELECTRONIC APPARATUS

CROSS-REFERENCE TO RELATED APPLICATIONS

This non-provisional application claims priority under 35 U.S.C. §119(a) on Patent Application No(s). 099138213 filed in Taiwan, R.O.C. on Nov. 5, 2010, the entire contents of which are hereby incorporated by reference.

BACKGROUND OF THE INVENTION

1. Field of Invention

The present invention relates to a cooling system, in particular, to a cooling system and a cooling method applicable to a server cabinet.

2. Related Art

In recent years, with the fast and vigorous development of the Internet, particularly in some large enterprises or cyber cafes, due to the service increasing requirement, the number of the servers increases, so that the arrangement of the servers becomes more centralized to save the space occupied by the servers. Therefore, the large-quantity and closely-arranged servers and other devices cause too much heat, thus causing the unstable operation of the whole server system, which is an important problem necessarily faced by a data center all the time.

In order to solve the heat dissipation problem in a closed machine room with a large quantity of servers, the conventional manner is configuring a cooling air conditioning system for heat dissipation, and when the number of the servers is few, cooling fans of the servers are used to reduce the temperature. However, because of the increased number of the servers and the closer arrangement of the cabinets, the cooling air blown from the conventional cooling air conditioning system fails to fully flow everywhere of the machine room, such that the heat air tends to centralize in certain areas to the unsteadiness of the server system.

Therefore, an ice water circulating type cooling device for a server is proposed, which comprises a compressor, a condenser, a vaporizing coil, a water tank, a cooling head, and a pump. The vaporizing coil surrounds the water tank, and is connected to the compressor and the condenser, so as to form a closed refrigeration circulating system. The cooling head has a water feeding column and a water outflow column which are respectively in communication with the water tank, and the cooling head is directly fixed on a heat resource of the server, for example, electronic components such as a central processing unit (CPU). When being used, the ice water in the water tank is delivered by the pump, and is circulated in the water feeding column of the cooling head to pass through high-temperature electronic components, and finally flows back into the water tank through the water outflow column of the cooling head, so as to achieve the cooling circulation.

According to the conventional ice water circulating type cooling device used by the data center, after the cooling water circulated to a chiller of the water tank passes through the heat resource, the temperature of the water is highly increased, and the water should be cooled for recirculation. Therefore, the data center must consume considerable power to cool the cooling water, thus causing poor power usage effectiveness (PUE).

Moreover, since the cooling water of the conventional ice water circulating type cooling device directly cool the server system through pipeline transmission, the operation temperature of the cooling water cannot be controlled, so that it is impossible to precisely control the operation temperature of a plurality of server systems of the data center. At the same time, since the server system is lack of the installation of firmware, it is impossible to control the internal pressure of the cooling device.

SUMMARY OF THE INVENTION

Accordingly, the present invention is a cooling system for a server and a cooling method for an electronic apparatus, which solve the problem that a cooling device for a server of a conventional data center must consume considerable power to reduce the temperature, and the problem that the cooling device for the server fails to precisely control the operation temperature of the cooling water and fails to control the internal pressure of the cooling device.

The present invention provides a cooling system for a server, which is applicable for heat dissipation of at least one server cabinet. The cooling system comprises at least one radiator, at least one cooling plate, a cooling assembly, a second storage tank, and a heat exchanger. The heat exchanger and the cooling plate are disposed in the server cabinet, the cooling assembly has a first storage tank which is used to carry a first cooling fluid, and the first storage tank is connected with the radiator. The second storage tank carries a second cooling fluid, and the second storage tank is connected with the cooling plate. The heat exchanger is connected to the radiator and the cooling assembly respectively, and the heat exchanger is connected to the cooling plate and the second storage tank respectively.

The first cooling fluid flows to the radiator and enters the heat exchanger, so as to constitute a first cooling loop. The second cooling fluid flows to the cooling plate and enters the heat exchanger, so as to constitute a second cooling loop. The second cooling loop is not in communication with the first cooling loop.

The first cooling fluid and the second cooling fluid perform heat exchange in the heat exchanger, such that the temperature of the second cooling fluid is reduced and the energy required for the second cooling fluid to return to a set temperature is also reduced.

The present invention provides a cooling system for a server, in which the server comprises at least one drawer, at least one circuit board is disposed on the drawer, and the circuit board has a first heat module.

The cooling system comprises at least one fan module, a radiator, a first cooling loop, a second cooling loop, and a heat exchanger. The fan module is used to provide airflow being blown to the drawer, so as to reduce the temperature of the drawer, and the radiator is disposed at an air-intake vent of the fan module. The first cooling loop has a first cooling fluid which is in thermal contact with the radiator, so as to reduce the temperature of the air at the air-intake vent of the fan module, and the second cooling loop has a second cooling fluid which is in thermal contact with the first heat module. The heat exchanger provides the heat exchange for the second cooling fluid after thermal contact with the first heat module and the first cooling fluid after thermal contact with the radiator, so as to reduce the temperature of the second cooling loop and increase the temperature of the first cooling loop.

The present invention provides a cooling method for an electronic apparatus, in which the electronic apparatus comprises at least one drawer, at least one circuit board is disposed on the drawer, and the circuit board has a first heat module and a second heat module.

The cooling method comprises the following steps. A first cooling loop is used to reduce the temperature of an air-intake vent of a fan module, a second cooling loop is used to reduce a part of heat energy generated by the electronic apparatus, and the fan module generates airflow to dissipate the rest heat energy generated by the electronic apparatus.

The present invention has the following effects. The temperature of the second cooling fluid is reduced through the heat exchanger, so as to reduce the energy required for the second cooling fluid to return to the set temperature.

Meanwhile, the temperature of the first cooling fluid is increase through the heat exchanger, so that obvious temperature difference exists between the first cooling fluid and the environment temperature. Therefore, the first cooling fluid can achieve rather good cooling effect in the cooling assembly only by using a natural cooling method, and it is unnecessary to cool the cooling fluid with the help of a cooling device such as a chiller.

In this way, not only the whole heat dissipation performance of the cooling system of the present invention is improved, but also the power required by the cooling system of the present invention is greatly reduced, thus achieving the efficacy of energy saving and high heat dissipation performance.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein.

DETAILED DESCRIPTION OF THE INVENTION

Figure 1:
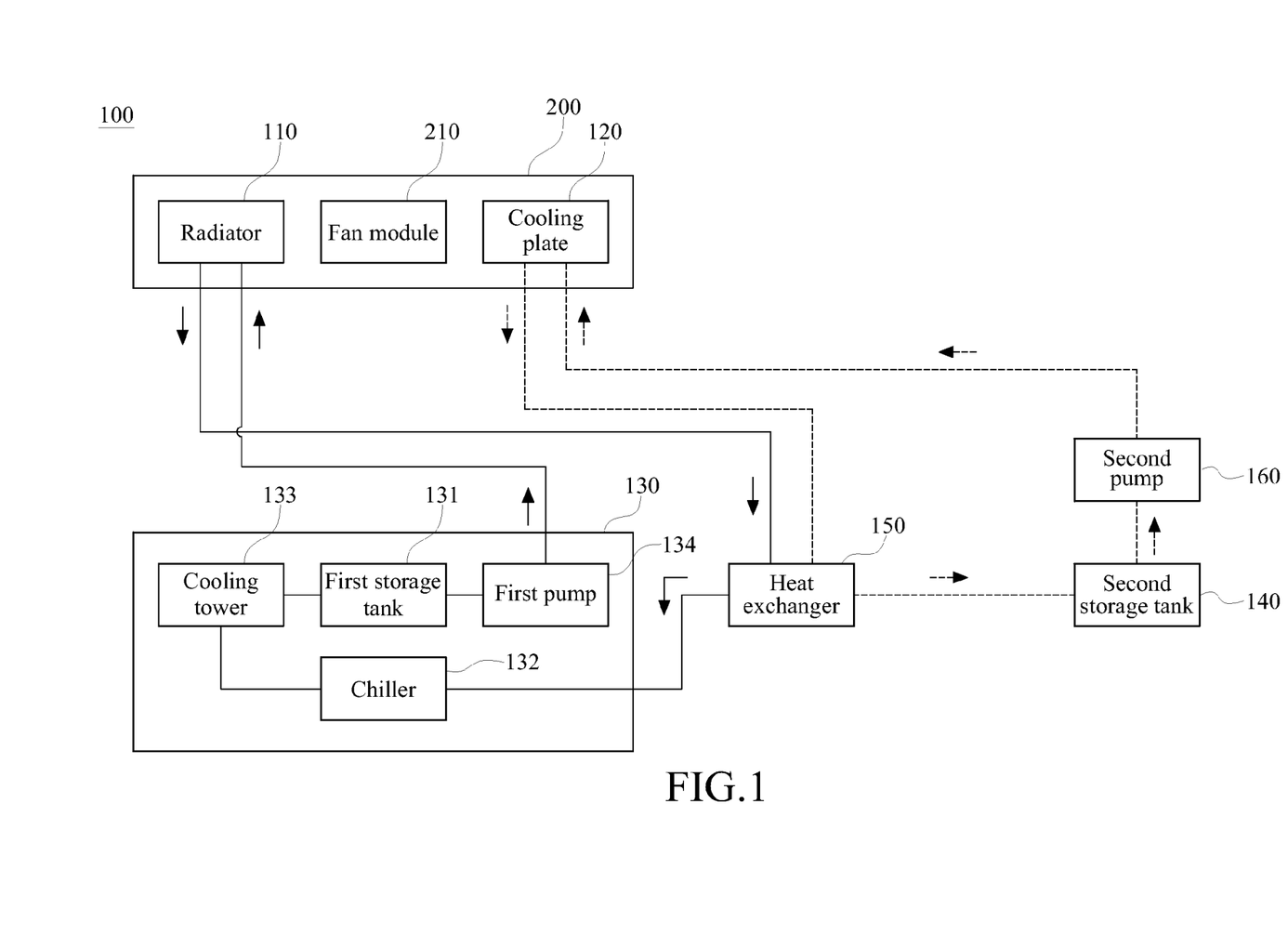
FIG. 1 is a schematic view of a system according to a first embodiment of the present invention.
Figure 5:
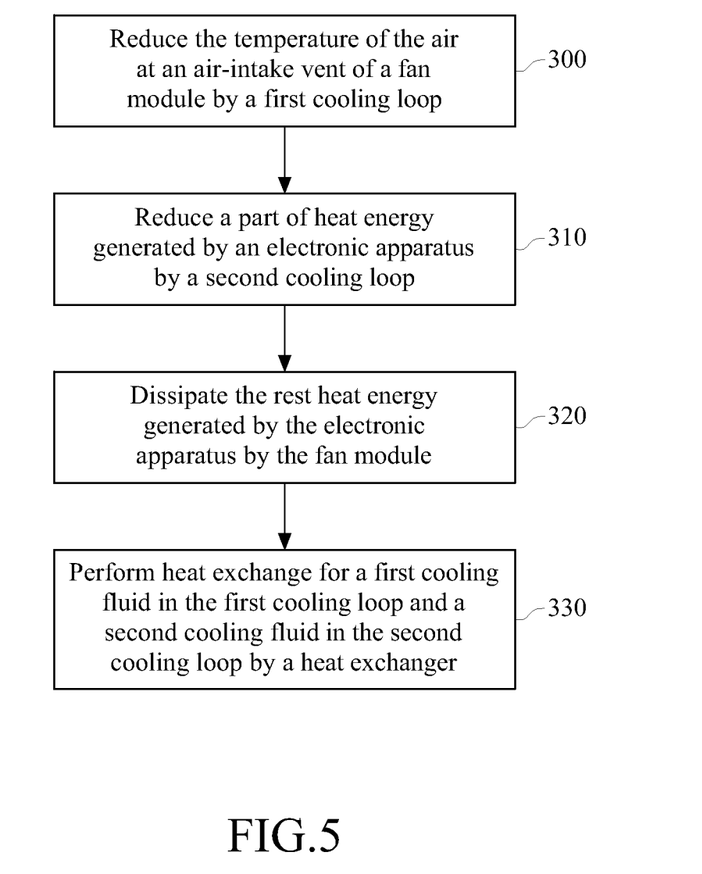
FIG. 5 is a flow chart of steps of a cooling method according to the present invention.

FIG. 1 is a schematic view of a system according to a first embodiment of the present invention, and FIG. 5 is a flow chart of steps of a cooling method for an electronic apparatus according to the present invention. As shown in the drawings, a cooling system 100 of the present invention is applicable for heat dissipation and temperature reducing of a server cabinet 200, in which at least one fan module 210 is disposed in the server cabinet 200, so as to perform heat dissipation on the electronic components of the server through convection. A thermograph (not shown) may be disposed in the server cabinet 200 to monitor the internal temperature thereof.

Figure 4:
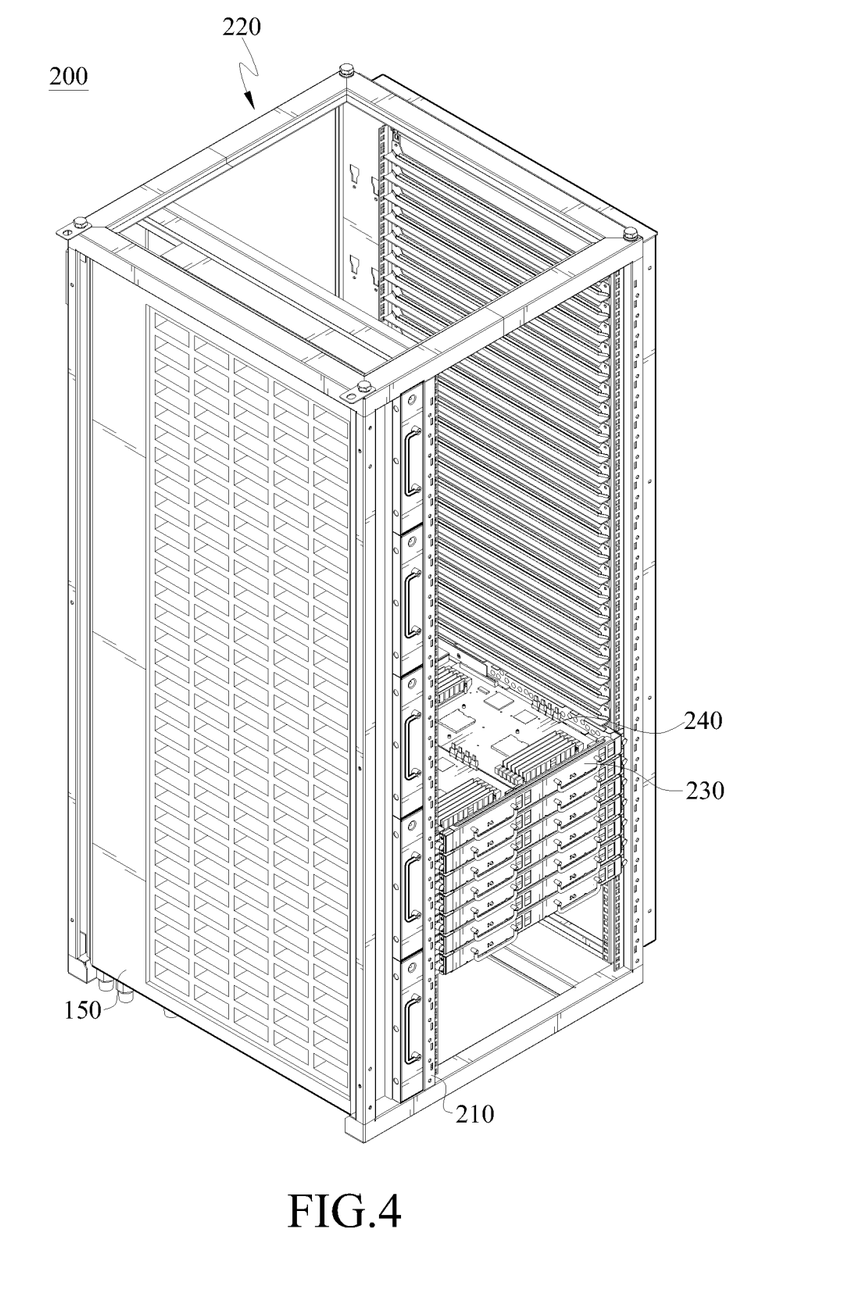
FIG. 4 is a schematic three-dimensional view of a server cabinet according to the present invention.

The server cabinet 200 shown in FIG. 4 comprises a rack 200, a drawer 230, at least one circuit board 240, and at least one fan module 210. The drawer 230 and the circuit board 240 are mounted in the rack 220, and the fan module 210 is also mounted on the rack 220 and generates airflow being blown to the circuit board 240 for heat dissipation. However, the present invention is focused on the configuration of the cooling system, and thus the structure of the server cabinet 200 will not be described in detail herein.

The circuit board 240 has a plurality of electronic components, and the main heat resource is a CPU which is referred to as a "first heat module" in the following. In addition, the electronic components besides the CPU may also generate heat energy, such as a memory, and this kind of component is referred to as a "second heat module" in the following.

Referring to FIG. 1, the cooling system 100 comprises a radiator 110, a cooling plate 120, a cooling assembly 130, a second storage tank 140, and a heat exchanger 150. The radiator 110 is disposed on one side of the server cabinet 200 (as shown in FIG. 4), and the cooling plate 120 is also disposed in the server cabinet 200.

The radiator 110 and the fan module 210 are disposed adjacent to each other, and the radiator 110 is located at an air-intake vent of the fan module 210, and therefore the radiator 110 may effectively reduce the air temperature at the air-intake vent of the fan module 210, so that the temperature of the airflow blown into the rack 220 is not much high. For example, the environment temperature in the server cabinet 200 is about 62° C., and the temperature of the airflow generated by the fan module 210 is controlled at 40° C. by the radiator 110, so that an obvious temperature difference exists between the airflow temperature entering the server cabinet 200 and the environment temperature in the server cabinet 200, thus causing good heat dissipation effect through convection in the server cabinet 200. Therefore, the heat energy generated by the electronic component such as the memory of the circuit board 240 (that is, the second heat module) is reduced through the airflow provided by the fan module 210.

In addition, the cooling plate 120 uses a fluid (such as water, a coolant or a high-temperature coolant) cooling manner, and the cooling plate 120 is disposed on the circuit board 240 in the server cabinet 200, so as to cool the main heat module of the circuit board 240, such as the CPU, that is the first heat module.

The cooling assembly 130 in this embodiment comprises a first storage tank 131, a cooling tower 133, and a first pump 134. A first cooling fluid, such as water, a coolant, or a high-temperature coolant, is carried in the first storage tank 131, which is not limited to this embodiment. The cooling tower 133 is connected to the heat exchanger 150 and the first storage tank 131, and the first pump 134 is connected to the first storage tank 131 and the radiator 110 respectively.

Referring to FIG. 1 continuously, a second cooling fluid, such as a coolant, a high-temperature coolant, or water, is carried in the second storage tank 140, which is not limited to this embodiment. The second storage tank 140 is connected to the heat exchanger 150, and the cooling system 100 of the present invention further comprises a second pump 160 which is connected to the second storage tank 140 and the cooling plate 120 respectively, so that the second storage tank 140 is connected with the cooling plate 120 through the second pump 160.

The heat exchanger 150 of the present invention is a plate heat exchanger, and uses a liquid-to-liquid heat exchange manner to reduce the temperature, but the present invention is not limited thereto. The heat exchanger 150 is connected to the radiator 110 and the cooling tower 133 of the cooling assembly 130 to constitute a first cooling loop, and moreover, the heat exchanger 150 is further connected to the second storage tank 140 of the cooling plate 120 to constitute a second cooling loop. The first cooling loop is not in communication with the second cooling loop, that is, the first cooling loop and the second cooling loop are loop systems operating independently.

As shown in FIG. 1 and FIG. 5, specifically, the first cooling fluid is drawn by the first pump 134 and flows to the radiator 110 from the first storage tank 131 to perform the heat dissipation. For example, the temperature of the first cooling fluid at this time is 32° C. After the heat dissipation, the first cooling fluid with the increased temperature flows out from the radiator 110 to the heat exchanger 150, for example, the temperature of the first cooling fluid after heating up is 38° C. Finally, the first cooling fluid flows back to the first storage tank 131 of the cooling assembly 130, so as to constitute the first cooling loop (as shown by the solid-line path), and the temperature of the air at the air-intake vent of the fan module 210 is reduced (Step 300). The second cooling fluid is drawn by the second pump 160 and flows to the cooling plate 120 from the second storage tank 140 to perform heat dissipation, for example, the temperature of the second cooling fluid at this time is 42° C. After the heat dissipation, the second cooling fluid with the increased temperature flows out from the cooling plate 120 to the heat exchanger 150, for example, the temperature of the second cooling fluid after heating up is 60° C. Finally, the second cooling fluid flows back to the second storage tank 140, so as to constitute the second cooling loop (as shown by the broken-line path), a part of the heat energy generated by the server cabinet 200 is reduced (Step 310). The airflow generated by the fan module 210 dissipates the rest heat energy generated by the server cabinet 200 (Step 320).

When the first cooling fluid and the second cooling fluid flow back to the heat exchanger 150 at the same time, the first cooling fluid (with the temperature of 38° C.) and the second cooling fluid (with the temperature of 60° C.) perform the process of liquid-to-liquid heat exchange in the plate heat exchanger 150, and thus the operation temperature of the second cooling fluid with the higher temperature is reduced to, for example, 42° C., and flows to the second storage tank 140 to store, so that the second cooling fluid keeps at a certain operation temperature (for example, the operation temperature of 42° C.) and the second cooling fluid can be repeatedly used to perform the heat dissipation of the circuit board 240. Through the process of the heat exchanger 150, the temperature of the first cooling fluid with the lower temperature is increased to 42° C. The first cooling fluid with the increased temperature flows back to the cooling tower 133 of the cooling assembly 130 to be sprayed in atomization, so as to perform the process of cooling, and finally, the first cooling fluid flows again to the first storage tank 131 to store, so that the first cooling fluid keeps at a certain operation temperature (for example, the operation temperature of 32° C.), thus performing repeated heat dissipation circulation on the radiator 110 (Step 330).

Since the temperature of the second cooling fluid flowing back to the second storage tank 140 is reduced (from 60° C. to 42° C.) through the heat exchanger 150, the energy required for the second cooling fluid to return to the set temperature is greatly reduced. At the same time, the temperature of the first cooling fluid flowing back to the cooling tower 133 is increased (from 38° C. to 42° C.) through the heat exchanger 150, so as to have an obvious temperature difference (ΔT) between the first cooling fluid and the environment temperature (the environment temperature is generally the room temperature of 23° C.). Therefore, when the first cooling fluid is spayed in atomization in the cooling tower 133, the natural cooling effect is obvious, and it is unnecessary to use any extra auxiliary cooling device such as the chiller to perform the cooling process on the first cooling fluid.

In this way, the power budget required by the whole cooling system 100 may be dramatically reduced, so as to achieve the efficacy of energy saving and high heat dissipation performance, and thus the PUE of the whole cooling system 100 is dramatically improved.

However, any person skilled in the art may correspondingly control the temperature values of the first cooling fluid and the second cooling temperature in each stage according to the actual environment temperature and the actual application requirement, which is not limited to the values in this embodiment.

Moreover, the second storage tank 140 of this embodiment may also be used to adjust the internal pressure of the cooling system 100, so that it is unnecessary for the cooling system 100 to use the design of a pressure pipeline, and the cooling capacity of the cooling plate 120 is improved at the same time.

Figure 2:
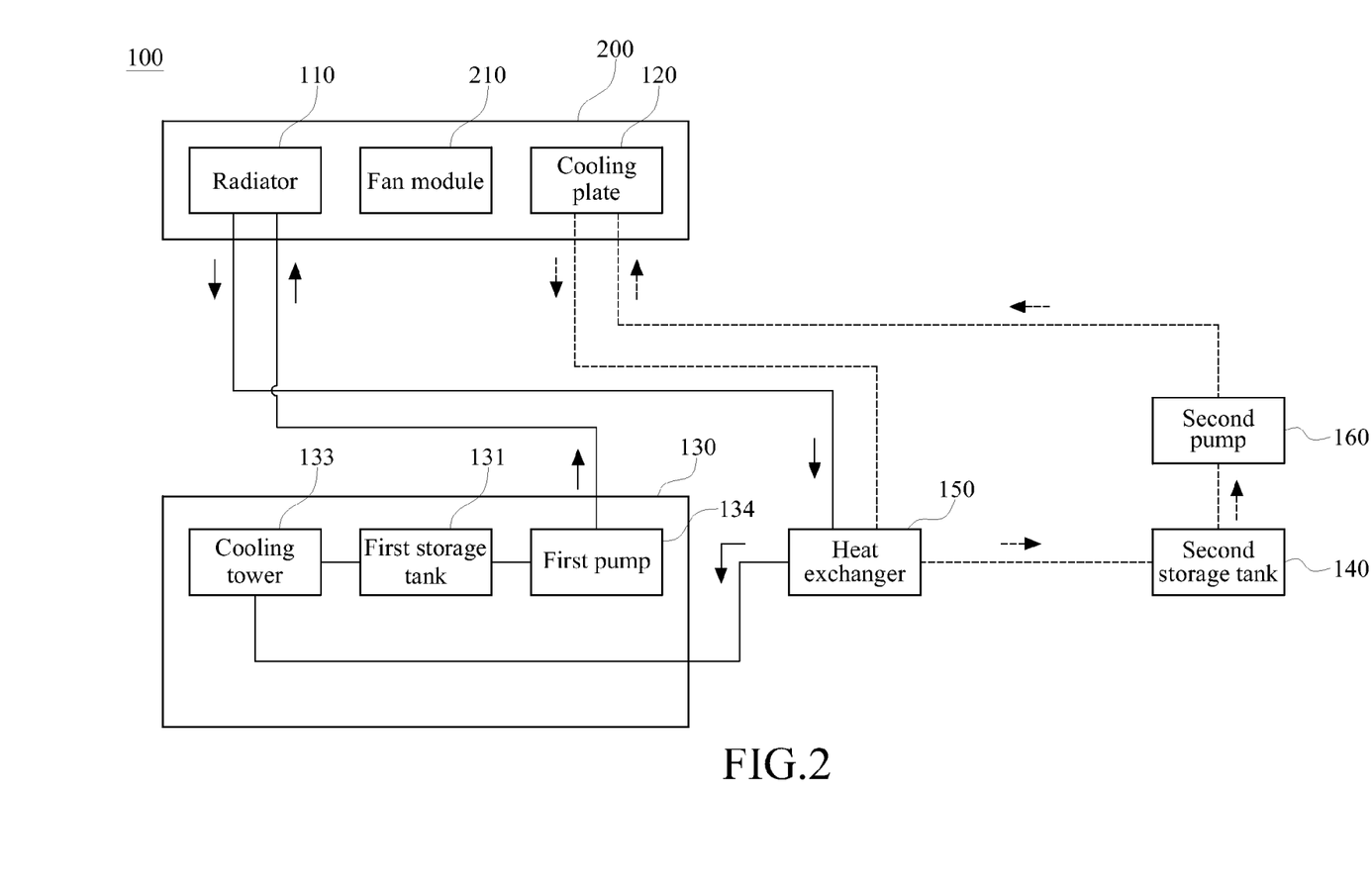
FIG. 2 is a schematic view of a system according to a second embodiment of the present invention.

FIG. 2 is a schematic view of a system according to a second embodiment of the present invention. Since the system structure of the second embodiment and that of the above first embodiment are approximately the same, only the difference is described in the following.

As shown in FIG. 2, a cooling system 100 of the second embodiment comprises a radiator 110, a cooling plate 120, a cooling assembly 130, a second storage tank 140, and a heat exchanger 150. The cooling assembly 130 comprises a first storage tank 131, a cooling tower 133, and a first pump 134, and further comprises a chiller 132 connected to the heat exchanger 150 and the cooling tower 133.

When the first cooling fluid after heating up flows back to the cooling assembly 130 to be cooled, the chiller 132 first provides the process of cooling, and the first cooling fluid is sprayed in atomization in the cooling tower 133 to perform secondary cooling.

The chiller 132 provided by this embodiment is in the auxiliary use to increase the heat dissipation velocity of the first cooling fluid, or the chiller 132 is used as a backup during the cooling of the first cooling fluid, which operates in the case that the temperature difference between the first cooling fluid and the environment temperature is not obvious, so as to accelerate the heat dissipation effect of the first cooling fluid. Therefore, compared with the conventional chiller, the chiller 132 provided by this embodiment has a lower power budget and does not cause much burden to the power consumption quantity of the cooling system 100 of the present invention, so that the PUE of the whole cooling system 100 is dramatically improved.

Figure 3:
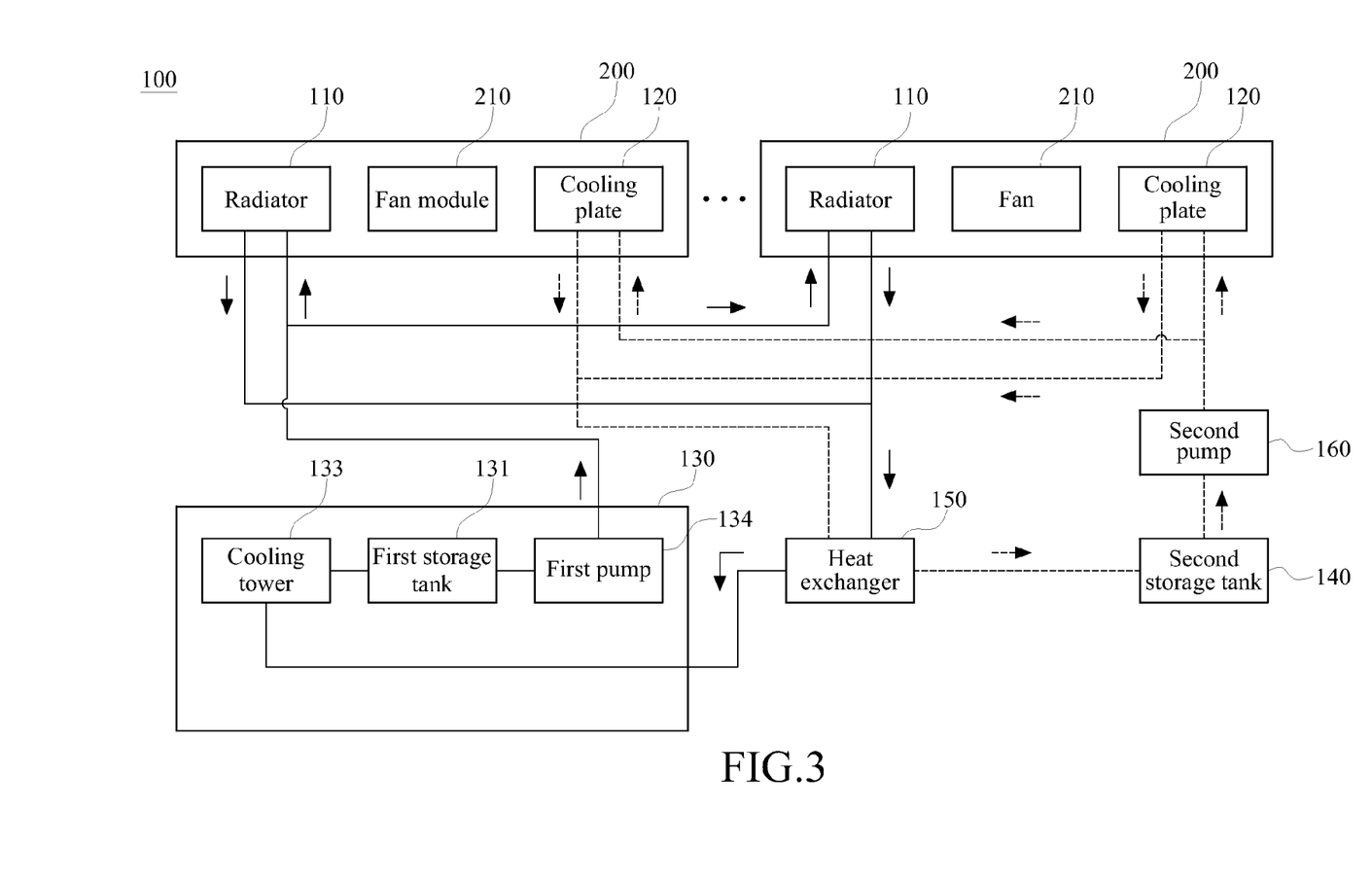
FIG. 3 is a schematic view of a system according to a third embodiment of the present invention.

FIG. 3 is a schematic view of a system according to a third embodiment of the present invention. As shown in FIG. 3, the system structure of the third embodiment and that of the above first embodiment are approximately the same, and only the difference is described in the following.

A cooling system 100 in the third embodiment is applicable for heat dissipation and cooling of a plurality of server cabinets 200, for example, the heat dissipation is performed on a data center formed by a large number of server cabinets in series connection.

The cooling system 100 of the third embodiment of the present invention comprises a plurality of radiators 110, a plurality of cooling plates 120, a cooling assembly 130, a second storage tank 140, and a heat exchanger 150. The radiators 110 and the cooling plates 120 are respectively disposed in the server cabinets 200.

The cooling assembly 130 in this embodiment comprises a first storage tank 131, a cooling tower 133, and a first pump 134. A first cooling fluid, such as water, a coolant or a high-temperature coolant, is carried in the first storage tank 131, which is not limited to this embodiment. The cooling tower 133 is connected to the heat exchanger 150 and the first storage tank 131, and the first pump 134 is connected to the first storage tank 131 and the plurality of radiators 110 respectively.

A second cooling fluid, such as a coolant, a high-temperature coolant, or water, is carried in the second storage tank 140, which is not limited to this embodiment. The second storage tank 140 is connected to the heat exchanger 150, and a second pump 160 of the cooling system 100 is connected to the second storage tank 140 and the plurality of cooling plates 120 respectively, so that the second storage tank 140 is connected with the plurality of cooling plates 120 through the second pump 160.

As shown in FIG. 3 and FIG. 5, the heat exchanger 150 is connected to the radiator 110 in the server cabinet 200 and the cooling tower 133 of the cooling assembly 130, and moreover, the heat exchanger 150 is further connected with the cooling plate 120 and the second storage tank 140 in the each server cabinet 200.

Specifically, the first cooling fluid is drawn by the first pump 134 and flows to each radiator 110 from the first storage tank 131 to perform the heat dissipation. For example, the temperature of the first cooling fluid at this time is 32° C. After the heat dissipation, the first cooling fluid with the increased temperature flows out from the radiator 110 to the heat exchanger 150, for example, the temperature of the first cooling fluid after heating up is 38° C. Finally, the first cooling fluid flows back to the first storage tank 131 of the cooling assembly 130, so as to constitute the first cooling loop (as shown in the solid-line path), and the temperature of the air at the air-intake vent of the fan module 210 is reduced (Step 300). The second cooling fluid is drawn by the second pump 160 and flows to each cooling plate 120 from the second storage tank 140 to perform heat dissipation, for example, the temperature of the second cooling fluid at this time is 42° C. After the heat dissipation, the second cooling fluid with the increased temperature flows out from the cooling plate 120 to the heat exchanger 150, for example, the temperature of the second cooling fluid after heating up is 60° C. Finally, the second cooling fluid flows back to the second storage tank 140, so as to constitute the second cooling loop (as shown by the broken-line path), such that a part of the heat energy generated by the server cabinet 200 is reduced (Step 310), and the airflow generated by the fan module 210 dissipates the rest heat energy generated by the server cabinet 200 (Step 320). Thus, the cooling system 100 of this embodiment can perform heat dissipation on a plurality of server cabinets 200 at the same time.

When the first cooling fluid and the second cooling fluid flow back to the heat exchanger 150 at the same time, the first cooling fluid (with the temperature of 38° C.) and the second cooling fluid (with the temperature of 60° C.) perform the process of heat exchange in the heat exchanger 150, and thus the operation temperature of the second cooling fluid with the higher temperature is reduced to, for example, 42° C., and flows to the second storage tank 140 to store, so that the second cooling fluid keeps at a certain operation temperature (for example, the operation temperature of 42° C.) and the second cooling fluid can be repeatedly used to perform the heat dissipation of the circuit board 240. Through the process of the heat exchanger 150, the temperature of the first cooling fluid with the lower temperature is increased to 42° C. The first cooling fluid with the increased temperature flows back into the cooling tower 133 of the cooling assembly 130 to be sprayed in atomization, so as to perform the process of cooling, and finally, the first cooling fluid flows again to the first storage tank 131 to store, so that the first cooling fluid keeps at a certain operation temperature (for example, the operation temperature of 32° C.), so as to perform repeated heat dissipation circulation on the radiator 110 (Step 330).

Since the temperature of the second cooling fluid flowing back to the second storage tank 140 is reduced (from 60° C. to 42° C.) through the heat exchanger 150, the energy required for the second cooling fluid to return to the set temperature is greatly reduced. At the same time, the temperature of the first cooling fluid flowing back to the cooling tower 133 is increased (from 38° C. to 42° C.) through the heat exchanger 150, so as to have an obvious temperature difference ($\Delta T$) between the first cooling fluid and the environment temperature (the environment temperature is generally the room temperature of 23° C.). Therefore, when the first cooling fluid is spayed in atomization in the cooling tower 133, the natural cooling effect is obvious, and it is unnecessary to use any extra auxiliary cooling device such as the chiller to perform the cooling process on the first cooling fluid.

In this way, the power budget required by the whole cooling system 100 may be dramatically reduced, so as to achieve the efficacy of energy saving and high heat dissipation performance, and thus the PUE of the whole cooling system 100 is dramatically improved.

However, any person skilled in the art may correspondingly control the temperature values of the first cooling fluid and the second cooling temperature in each stage according to the actual environment temperature and the actual application requirement, which is not limited to the values of this embodiment.

Moreover, the second storage tank 140 of this embodiment may also be used to adjust the internal pressure of the cooling system 100, so that it is unnecessary for the cooling system 100 to use the design of a pressure pipeline, and the cooling capacity of the cooling plate 120 is improved at the same time.

The second cooling fluid flowing back to the second storage tank interacts with the first cooling fluid through the heat exchanger, so that the temperature of the second cooling fluid is reduced, thus reducing the energy required for the second cooling fluid to return to the set temperature.

At the same time, the first cooling fluid flowing back to the cooling tower interacts with the second cooling fluid through the heat exchanger, so that the temperature of the first cooling fluid is increased, and an obvious temperature difference exists between the first cooling fluid and the environment temperature. In this way, the first cooling fluid in the cooling tower can achieve rather good cooling effect only by using a natural cooling method of spraying in atomization, and it is unnecessary to perform cooling with the help of extra cooling devices.

Through the present invention, not only the whole heat dissipation performance of the cooling system is improved, but also the power budget required by the cooling system of the present invention is dramatically reduced, thus achieving the efficacy of energy saving and high heat dissipation performance.

What is claimed is:
1. A cooling system for a server, applicable to at least one server cabinet, comprising:
    at least one radiator and at least one cooling plate, respectively disposed in each of the at least one server cabinet;
    a cooling assembly, having a first storage tank, wherein the first storage tank carries a first cooling fluid, and the first storage tank is connected with each of the at least one radiator;

a second storage tank, carrying a second cooling fluid, wherein the second storage tank is connected with each of the at least one cooling plate; and a heat exchanger, connected to each of the at least one radiator and the cooling assembly respectively, wherein the heat exchanger is further connected to each of the at least one cooling plate and the second storage tank respectively;

wherein the first cooling fluid flows to each of the at least one radiator, and enters the heat exchanger, so as to constitute a first cooling loop; the second cooling fluid flows to each of the at least one cooling plate, and enters the heat exchanger, so as to constitute a second cooling loop; the second cooling loop is not in communication with the first cooling loop; and the first cooling fluid and the second cooling fluid perform heat exchange in the heat exchanger.

2. The cooling system for the server according to claim 1, wherein the cooling assembly comprises:

a cooling tower, connected to the heat exchanger and the first storage tank respectively, wherein the first cooling fluid flows to the cooling tower for cooling, and the first cooling fluid is delivered back to the first storage tank; and a first pump, connected to the first storage tank and each of the at least one radiator respectively, wherein the first pump draws the first cooling fluid located in the first storage tank to flow to each of the at least one radiator.

3. The cooling system for the server according to claim 2, wherein the cooling assembly further comprises a chiller connected to the heat exchanger and the cooling tower, and the chiller receives the first cooling fluid flowing in the heat exchanger.

4. The cooling system for the server according to claim 1, further comprising a second pump, connected to the second storage tank and each of the at least one cooling plate respectively, wherein the second pump draws the second cooling fluid in the second storage tank to flow to each of the at least one cooling plate.

5. The cooling system for the server according to claim 1, wherein the first cooling fluid is water, and the second cooling fluid is a coolant or water.

6. The cooling system for the server according to claim 1, wherein the heat exchanger is a plate heat exchanger.

* * * * *